United States Patent
Sasaki et al.

(10) Patent No.: US 6,424,014 B2
(45) Date of Patent: Jul. 23, 2002

(54) SEMICONDUCTOR ELEMENT WITH ELECTRIC FIELD REDUCING DEVICE MOUNTED THEREIN FOR INCREASING DIELECTRIC STRENGTH

(75) Inventors: Katsuhito Sasaki, Tokyo; Isao Kimura; Mamoru Ishikiriyama, both of Kanagawa, all of (JP)

(73) Assignee: Oki Electric Industry CO,Ltd., Tokyo (JP)

( * ) Notice: Subject to any disclaimer, the term of this patent is extended or adjusted under 35 U.S.C. 154(b) by 0 days.

(21) Appl. No.: 09/734,741

(22) Filed: Dec. 13, 2000

(30) Foreign Application Priority Data

Feb. 25, 2000 (JP) .......................................... 2000-048629

(51) Int. Cl.⁷ ............................................. H01L 29/76
(52) U.S. Cl. ..................... 257/368; 257/488; 257/494; 257/587; 257/630
(58) Field of Search ................................ 257/368, 488, 257/494, 587, 630

(56) References Cited

U.S. PATENT DOCUMENTS

| 5,040,045 A | | 8/1991 | McArthur et al. |
| 5,311,052 A | | 5/1994 | Stengl et al. |
| 5,315,139 A | * | 5/1994 | Endo ........................... 257/409 |
| 5,714,396 A | * | 2/1998 | Robb et al. ................... 437/31 |
| 5,731,627 A | | 3/1998 | Seok |
| 6,150,702 A | * | 11/2000 | Funaki et al. ............... 257/409 |

FOREIGN PATENT DOCUMENTS

| JP | 60-77470 | | 3/1994 | |
| JP | 11-204632 | * | 7/1999 | .......... H01L/21/76 |

* cited by examiner

Primary Examiner—Eddie Lee
Assistant Examiner—Matthew E. Warren
(74) Attorney, Agent, or Firm—Rabin & Berdo, P.C.

(57) ABSTRACT

Expansion promotion means (24) for more efficiently promoting the expansion of the depletion layer (19) than the electrically insulating film(14) having a suppressor electrode layer (20) buried therein is arranged between narrow portions (23b) of the suppressor electrode layer to control the expansion of the depletion layer (19), by which arrangement the spacing s between the narrow portions (23b) can be reduced without decreasing the field reducing effect of the field reduction means, which contains the suppressor electrode layer.

19 Claims, 11 Drawing Sheets

SEMICONDUCTOR ELEMENT WITH ELECTRIC FIELD REDUCING DEVICE MOUNTED THEREIN FOR INCREASING DIELECTRIC STRENGTH

BACKGROUND OF THE INVENTION

1. Field of the Invention

The present invention relates to a semiconductor device using a semiconductor substrate, and more particularly to a semiconductor device having mounted therein electric field reducing means for increasing dielectric strength.

2. Description of the Related Art

In an integrated circuit formed by mounting various circuit elements, such as transistors, in a semiconductor substrate, a first impurity region is formed, in the surface of the semiconductor substrate, as a functional element that has a conductivity type opposite to the conductivity type of the semiconductor substrate. When a backward voltage is applied between the first impurity region and the semiconductor substrate through a current path extending on the oxide film covering the semiconductor substrate, a depletion layer expands from the impurity region along the surface of the semiconductor substrate below the current path according to the voltage value.

When the depletion layer reaches the surrounding circuit area, it exerts an adverse effect on the electrical characteristics of the circuit area. To curb the expansion of the depletion layer toward the surrounding circuit, there is a technique to provide as a channel stopper in the semiconductor substrate a second impurity region which is of the same conductivity type as the semiconductor substrate and has a higher impurity density than that of the substrate.

However, the channel stopper is not enough because when a relatively low voltage is applied, the depletion layer would reach the channel stopper and as the voltage is increased, a breakdown occurs in the depletion at a lower voltage than the destructive voltage at the junction plane between the first impurity region and the semiconductor substrate.

Therefore, as disclosed in JP-A-11-204632 (Japanese Patent Application No. 10-17848), the present inventors have proposed an electric field reducing technique to arrange electrodes mutually spaced apart from each other along the current path in the oxide film under the current path, and to connect the potential of the semiconductor substrate to the electrodes.

According to the field reducing technique, the expansion of the depletion layer is controlled by degrees by the electrodes as the applied voltage is increased, or in other words, by allowing the depletion layer to expand step by step as the voltage is increased, it is possible to consider a balance between the breakdown voltage in the depletion layer and the destructive voltage at the junction, which makes it possible to improve the general dielectric property of the semiconductor device.

However, the dielectric strength improving technique such as this requires that the electrodes supplied with a specified potential be arranged spaced apart from each other in the expanding direction of the current path and that a specified spacing be provided between the electrode. Therefore, such a technique is not advantageous for dimensional reductions to obtain semiconductor devices in reduced sizes where a large number of electrodes are required.

SUMMARY OF THE INVENTION

The object of the present invention is to provide a semiconductor device that can be reduced in size without sacrificing the dielectric property.

The present invention has been made with attention directed to the fact in the above-mentioned field reducing technique that the expansion of the depletion layer is controlled by degrees such that a balance between the breakdown voltage in the depletion layer and the destructive voltage at the junction can be maintained by combining two opposite functions: the restraint of the depletion layer expansion by the electrodes and the prolongation of the depletion layer at the spacing areas between the electrodes in the insulating film in which the electrodes are buried. Basically, the feature of the present invention is that means for promoting the expansion of the depletion layer more than the insulating film does is arranged between the electrodes to thereby substantially make narrower the spacing between the electrodes without disturbing the balance mentioned above, with the result that a smaller-size semiconductor device can be produced without reducing the dielectric strength.

According to the present invention, there is provided a semiconductor device which comprises a semiconductor substrate of one conductivity type, p-type or n-type; a first impurity region of the other conductivity type, p-type or n-type, having applied between itself and the semiconductor substrate a backward voltage through an current path extending on an electrically insulating film providing on the surface of the semiconductor substrate; a second impurity region of the same conductivity type as the semiconductor substrate and with a higher impurity density than the impurity density of the semiconductor substrate, the second impurity region being formed in the surface of the semiconductor substrate spaced from the first impurity region, to restrain the depletion layer from expanding the first impurity region below and along the current path; and a suppressor electrode layer comprising a plurality of thin portions arranged in the electrically insulating film and mutually spaced apart from each other in the direction of the current path and placed at substantially the same potential as the semiconductor substrate, to restrain the depletion layer from expanding toward the second impurity region.

According to the present invention, expansion promotion means for promoting the expansion of the depletion toward the second impurity region may be arranged between the narrow portions of the suppressor electrode layer.

The above-mentioned expansion promotion means for more efficiently promoting the expansion of the depletion layer than the electrically insulating film, which has buried therein the narrow portions of the suppressor electrode layer, makes it possible to cause the spacing of the respective narrow portions to become narrower and also cause the distance between the two impurity regions to become shorter without incurring loss of the field reduction effect of the field reducing means, which includes the expansion promotion means and the suppressor electrode layer. Therefore, the semiconductor device can be reduced in size without decreasing its dielectric property.

The expansion promotion means may be formed by the thin portion of the electrically insulating film defined by the surface of the semiconductor substrate and the protrusions, protruding toward the substrate between the narrow portions, of the current path extending on the insulating film on the semiconductor substrate.

The electrically insulating film at its thin portions promotes the expansion of the depletion layer by the electrostatic effect by the potential applied to the current path on the insulating film.

The expansion promotion means may be formed by expansion promotion electrodes arranged in the areas corresponding to the spaces between the narrow portions of the suppressor electrode layer.

The expansion promotion electrodes may be arranged spaced from the narrow portion of the suppressor electrode layer on the same plane as the suppressor electrode layer. As an alternative to this arrangement, the expansion promotion electrodes may be arranged in the electrically insulating film in the areas on a plane between the suppressor electrode layer and the semiconductor substrate surface, which correspond to the spaces between the narrow portions.

The expansion promotion electrodes may be placed in electrically floating state or at a potential substantially equal to the potential of the first impurity region. Either way, the expansion of the depletion layer is promoted more than the electrically insulating film that fills up the spaces between the narrow portions of the suppressor electrode layer. To increase the depletion layer expansion effect, it is desirable that the expansion promotion electrodes should be supplied with a potential substantially equal to the potential of the first impurity region.

The expansion promotion means may be formed by a dielectric material that has a larger dielectric constant than that of the electrically insulating film. Local increases in dielectric constant of the electrically insulating film, which act as substantial decreases in the thickness of that insulating film, offer the same expansion reducing effects as local decreasing of thickness of that insulating film.

Instead of providing the expansion promotion means, the narrow portions of the suppressor electrode layer may be arranged in a circumferential direction of the first impurity region.

The current path arranged on the electrically insulating film, which has the suppressor electrode layer buried therein, includes a deformed portion, as a part of the current path, arranged in the direction in which the narrow portions are arranged.

In this case, a required number of narrow portions are arranged not in a straight line from the first impurity region to the second impurity region as the channel stopper, but in a circumferential direction of the first impurity region. Therefore, even when a large number of narrow portions are required, it is possible to arrange a large number of narrow portions of the suppressor electrode layer without incurring any dimensional increase in the distance between the two impurity regions.

Further, even by making a contrivance to the slits between the narrow portions of the suppressor electrode layer, the semiconductor device can be reduced in size without decreasing its dielectric strength.

More specifically, the slits between the narrow portions of the suppressor electrode layer can be added with side extensions extending beyond both side edges of the current path, which stretches from the first impurity region, and inclined at an acute angle toward the extending direction of the current path. Because the slits, which are filled with the electrically insulating film, extend beyond the side edges of the current path while the side extensions are inclined toward the extending direction of the depletion layer, the side extensions guide the depletion layer along their extending directions, so that it becomes possible to effectively prevent a breakdown from occurring in the depletion layer and reduce the width of the respective slits, in other words, the spacing between the narrow portions.

DESCRIPTION OF PREFERRED EMBODIMENTS

Preferred embodiments of the present invention will be described in detail with reference to the accompanying drawings.

<Embodiment 1>

Figure 1:
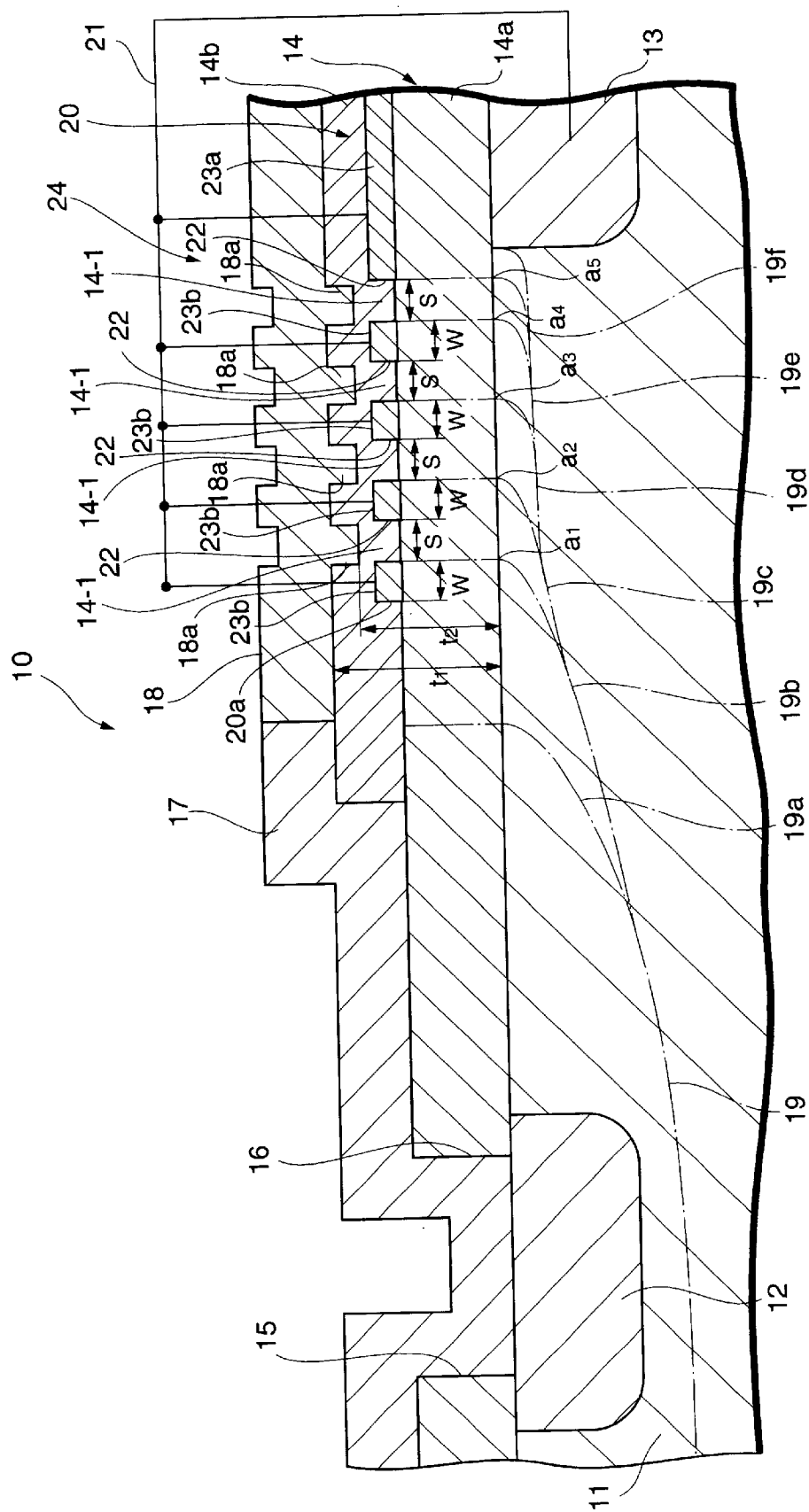
FIG. 1 is a sectional view of the first embodiment of a semiconductor device according to the present invention.
Figure 2:
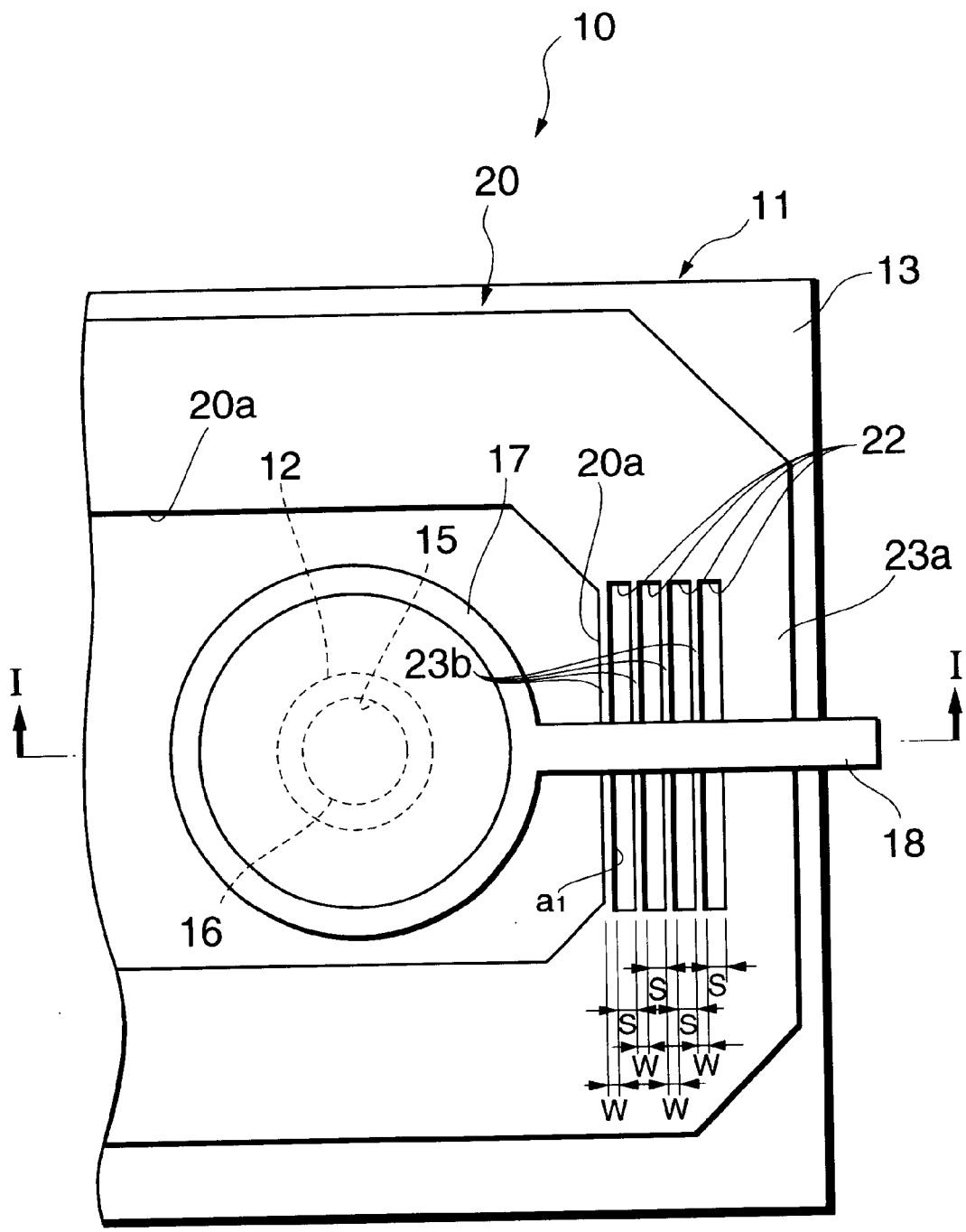
FIG. 2 is a plan view showing a part of the first embodiment of the semiconductor device according to the present invention.

FIGS. 1 and 2 show a first embodiment of a semiconductor device according to the present invention.

A semiconductor device 10 according to the present invention is a high voltage diode in the case shown in FIGS. 1 and 2, and is mounted in a semiconductor substrate 11 made of an n-type silicon with a specific resistance of 20 $\Omega$-cm, for example.

A first impurity region 12 of a circular shape is formed as the cathode on the surface of the semiconductor substrate 11. The first impurity region 12 has a p conductivity type opposite the conductivity type of the semiconductor substrate 11.

As clearly shown in FIG. 2, on the surface of the semiconductor substrate 11, there is formed a second impurity region 13 encircling the first impurity region 12 but spaced apart from the first impurity region 12. The second impurity region 13 has the same conductivity type as that of the semiconductor substrate 11 and is a more highly doped region than the semiconductor substrate 11. This second impurity region 13 is used as the cathode of the diode and serves as a channel stepper, which will be described later.

As shown in FIG. 1, electrically insulating film 14 is formed in the surface of the semiconductor substrate 11, but is omitted in FIG. 2 for simplicity of the drawing.

In the example shown in FIG. 1, the electrically insulating films 14 forms a stacked-layer structure including a lower insulating layer 14a with a thickness of 1 $\mu$m, for example, which directly covers the semiconductor substrate 11 and an upper insulating layer 14b with a thickness of 1 $\mu$m, for example, which partly covers the lower insulating layer 14a. The lower insulating film 14a can be formed, for example, by thermal oxidation of the semiconductor substrate 11 and the upper insulating film 14b can be formed by CVD, for example.

As shown in FIG. 1, in that exposed portion of the lower insulating layer 14a which extends beyond the upper insulating layer 14b, a contact hole 15 is formed to expose the first impurity region 12. A contact 16 is passed through this contact hole 15 and connected to the first impurity region 12. In the example shown in FIG. 1, a circular field plate 17, which is shown in FIG. 2 as located on the electrically insulating film 14 and covering the first impurity region 12, is formed in a monolithic body with the contact 16.

The field plate 17, as is well known, reduces a concentration of local electric fields at the peripheral edge of the generally circular depletion layer (19), which will be described later, in a manner of surrounding the first impurity region 12, thus decreasing the electric fields there. The field plate 17 consists of a polysilicon having a certain conductivity type, and in the example in FIGS. 1 and 2, forms a current path 18 as one body with the field plate 17, and therefore the current path 18 is connected to the first impurity region 12.

As shown in FIG. 2, the current path 18 is at one end adjacent to the outer edge of the field plate 17 and extends above the electrically insulating film 14 over the impurity region 13 while going across the second impurity region 13.

The second impurity region 13 is connected to a well-known wire, not shown. A backward voltage is applied between the first impurity region 12 as the anode through the current path 18 leading to the first impurity region 12 and the second impurity region 13 as the cathode through the well-known wire.

When a backward voltage is applied between the anode 12 and the cathode 13, the depletion layer 19 is formed around the first impurity region 12 as depicted in FIG. 1.

When the backward voltage is relatively low, the depletion layer 19 is formed in a generally circular form in the vicinity of the first impurity region 12 in a manner of surrounding this impurity region 12. At this time, as indicated by an imaginary line 19a, the peripheral area of the depletion region 19 expands radially substantially evenly in all directions toward a circular area corresponding to the above-mentioned peripheral area, which is defined by the periphery of the field plate 17. Consequently, the well-known field reducing effect of the field plate 17 prevents a breakdown by local concentration of electric fields in the circular depletion layer 19a.

As the backward voltage between the anode 12 and the cathode 13 is increased, the depletion layer 19, which has been expanded by the field plate 17, tends to further expand in its general shape. That peripheral area (19a) of the depletion layer 19 corresponding to the current path 18 tends to expand toward the second impurity region 13, which functions as a channel stopper under the current path.

To limit the above-mentioned general expansion of the periphery (19a) of the depletion layer 19 and to adequately control the expansion toward the second impurity region 13 of that portion of the peripheral area (19a) under the current path 18, the suppressor electrode layer 20 is formed by a conductive polysilicon with a thickness of 1000 Å, for example.

As shown in FIG. 2, the suppressor electrode layer 20 is formed in a ring shape and substantially covers the second impurity region 13, and the inner edge 20a extends beyond the second impurity region 13 toward the first impurity region 12. The suppressor electrode layer 20 is supplied through the wire 21, shown in FIG. 1, with the potential of the second impurity region 13, that is, the potential of the semiconductor substrate 11, to limit the expansion of the depletion layer 19 mentioned above.

As is generally known, the depletion layer 19 has its expansion suppressed when its peripheral area 19a reaches the inner edge 20a of the suppressor electrode layer 20, which is at the potential of the substrate.

To suitably control the expansion of the depletion layer 19 under the current path 18, the suppressor electrode layer 20 has formed therein a plurality of mutually parallel slits 22, each having a width s, those slits lying at right angles to the current path 18. In the example shown in FIG. 2, the slits 22 are arranged spaced a distance w from each other.

As is clear from a sectional view in FIG. 1, taken along the line I—I in the stretching direction of the current path as shown in FIG. 2, the suppressor electrode layer 20 has component portions defined by the slits 22. More specifically, the component portions of the suppressor electrode layer 20 include an electrode main body 23a located over the second impurity region 13 and a plurality of narrow electrode portions 23b each with a width w, spaced a distance s from each other, the distance s corresponding to the width of each slit.

As mentioned above, the suppressor electrode layer 20 is electrically connected to the second impurity region 13 by the wire 21 and is held at the potential of the semiconductor substrate 11 equal to the potential of the second impurity region 13. Therefore, the electrode main body 23a and the narrow electrode portions 23b limit the expansion of the depletion layer under the current path 18. Further, the electrode main body 23a and the narrow electrode portions 23b are arranged in the extending direction of the current path 18, mutually spaced by an adequate distance from the second impurity region 13 toward the first impurity region 12. As has been well known, this arrangement adequately controls the expansion of the depletion layer 19 when the depletion layer 19 is going to expand along the current path 18 toward the second impurity region 13 as the applied backward voltage is increased.

In other words, after a circular depletion layer 19a defined by the circular field plate 17 has been formed by the application of a backward voltage as mentioned above, when a backward potential between the first impurity region 12 and the second impurity region is further increased, the depletion layer 19a reaches a point a1 defined by the outer edge of the narrow electrode portion 23b closest to the first impurity region 12 before a breakdown occurs at the depletion layer 19a caused by concentrated electric fields in the depletion layer. The depletion layer 19b that has reached the point a1 is strongly prevented from further expansion at the point a1 by the narrow electrode portion 23b in spite of the increase in backward voltage.

If the backward voltage is further increased, before the depletion layer 19 breaks down, the depletion layer 19 is allowed to expand to an outer narrow electrode 23b adjacent across the slit 22 to the current narrow electrode 23b. The depletion layer 19 is subjected to graduated restrictions in expansion (19a to 19f) by the narrow electrode portions 23b and the electrode main body 23a at respective points (a2 to a5) defined by the perimeters of the depletion layer.

By control of graduated expansion of the depletion layer 19, a balance is achieved between the breakdown voltage value in the depletion layer 19 and the junction dielectric strength value between the first impurity region 12 and the semiconductor substrate 11 so that these two values become substantially equal, thereby improving the dielectric strength of the semiconductor device 10.

In conjunction with the suppressor electrode layer 20 for adequate control of the expansion of the depletion layer 19, as shown in FIG. 1, in the semiconductor device 10 according to the present invention, there is also provided expansion promotion means 24 for promoting the expansion of the depletion layer 19 toward the second impurity region 13.

In the first embodiment shown in FIG. 1, the expansion promotion means 24 consists of thin portions 14-1 of the electrically insulating film 14 that fills spaces among the electrode main body 23a and the narrow electrode portions 23b.

In the example shown in FIG. 1, the electrically insulating film 14 is a stacked layer structure consisting of a lower insulating layer 14a covering the semiconductor substrate 11 and an upper insulating layer 14b formed on the lower insulating layer 14a. The current path 18 formed on the upper insulating layer 14b includes protrusions 18a protruding toward the semiconductor substrate 11 between the electrode main body 23a and the narrow electrode portions 23b. The protrusions 18a protrude into the suppressor electrode layer 20 at certain intervals.

As the protrusions 18a of the current path 18 protrude toward the semiconductor substrate 11, the thin portions 14-1 with a smaller thickness t2 than the thickness t1 of the electrically insulating film 14, which fill the space between the non-protruding portions of the current path 18 and the semiconductor substrate 11, are defined by the electrode main body 23a and the narrow electrode portions 23b.

To form the thin portions 14-1, the suppressor electrode layer 20 is formed on the lower insulating layer 14a of the electrically insulating film 14 formed on the semiconductor substrate 11, and then the upper insulating layer 14b is formed in a substantially uniform thickness to cover the suppressor electrode layer 20. After this, the upper insulating layer 14b is etched at its locations for the slits 22 to form grooves about 0.5 μm deep by photolithography, for example. On the upper insulating layer 14b where etched grooves have been formed, a material for the current path 18 is deposited by a well-known method, and this material is patterned by photolithography to obtain the current path 18 with protrusions 18a at locations corresponding to the etched grooves. Thus, the thin portions 14-1 are formed.

At the thin portions 14-1 formed between the narrow electrode portion portions 23b, the distance between the current path 18 and the surface of the semiconductor substrate 11, on which the electrically insulating film 14 is formed, is smaller than that at the adjacent thick electrode portions, and the electrostatic effect due to the potential applied to the current path facilitates the expansion of the depletion layer 19 in the area of the slits 22. Therefore, by forming the thin portions 14-1 effective in expanding the depletion layer 19, the width s of each slit 22 contributing to the suitable expansion of the depletion layer 19 can be made smaller from 6 μm to 4 μm, for example. Consequently, the distance s between the narrow electrode portions 23b can be set to a smaller value than before.

Therefore, according to the semiconductor device 10 of the present invention, in which the expansion promotion means 24 is provided, the width s of each slit 22, in other words, the distance s between the narrow electrode portions 23b or between the electrode main body 23a and the adjacent narrow portion 23b can be decreased without sacrificing the dielectric strength, so that the space between the first impurity region 12 and the second impurity region 13 can be set to a small value, which makes it possible to reduce the size of the semiconductor device 10.

<Embodiment 2>

Figure 3:
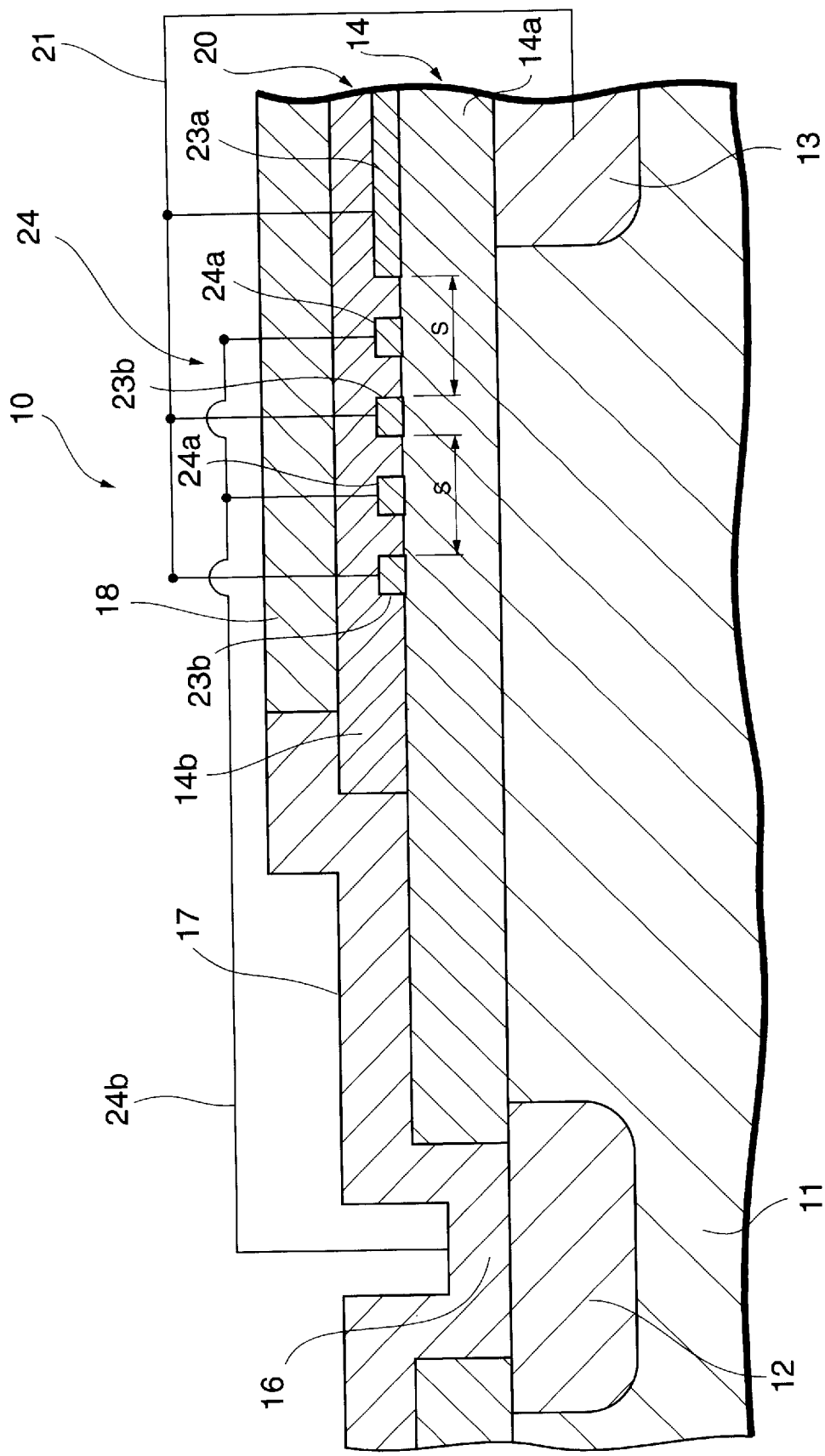
FIG. 3 is a sectional view of a second embodiment of the semiconductor device according to the present invention.

In the example shown in FIG. 3, the expansion promotion means 24 consists of expansion promotion electrodes 24a made of the same conductive material as that of the suppressor electrode layer 20. The expansion promotion electrodes 24a are formed on the plane of the lower insulating layer 14a on which the suppressor electrode layer 20 is formed. The expansion promotion electrodes 24a, which are electrically insulated from the suppressor electrode layer 20, are arranged between the narrow electrode portions 23b or between the narrow electrode portion 23b and the electrode main body 23a. Further, the expansion promotion electrodes 24a are supplied with the potential of the first impurity region 12 through the current path 24b extending from the field plate 17 in the example shown in FIG. 3.

The expansion promotion electrodes 24a are arranged between the narrow electrode portions 23b or between the narrow electrode portion 23b and the electrode main body 23a, which are all supplied with the potential of the second impurity region 13. The expansion promotion electrodes are supplied with the potential of the first impurity region 12, which is opposite in polarity to the potential of the suppressor electrode layer 20 supplied from the second impurity region 13 to suppress the expansion of the depletion layer 19.

Therefore, the expansion promotion electrodes 24a, whether they are between the narrow electrode portions 23b or between the narrow portion and the electrode main body 23a, promote the expansion of the depletion layer 19 in opposition to the suppressive action to the expansion of the depletion layer 19 by the narrow portions 23b.

Consequently, the expansion promotion electrodes 24a arranged between the narrow electrode portions 23b and between the narrow portion 23b and the electrode main body 23a make it possible to reduce the adequate distance s from 4 μm to 3 μm, for example.

Therefore, according to the expansion promotion means 24 having the expansion promotion electrodes 24a, as in the first embodiment, it is possible to reduce the size of semiconductor device 10 without decreasing the dielectric strength of the semiconductor device.

Even if the expansion promotion electrodes 24a are used as floating electrodes, the expansion promotion electrodes 24a can be made to promote the expansion of the depletion layer 19. However, with the expansion promotion electrodes 24a arranged on the same plane as the suppressor electrode layer 20 so that the expansion promotion electrodes 24a can perform a sufficient expansion promotion action as mentioned above, it is desirable to place the expansion promotion electrodes 24a at the same potential as the first impurity region 12.

<Embodiment 3>

Figure 4:
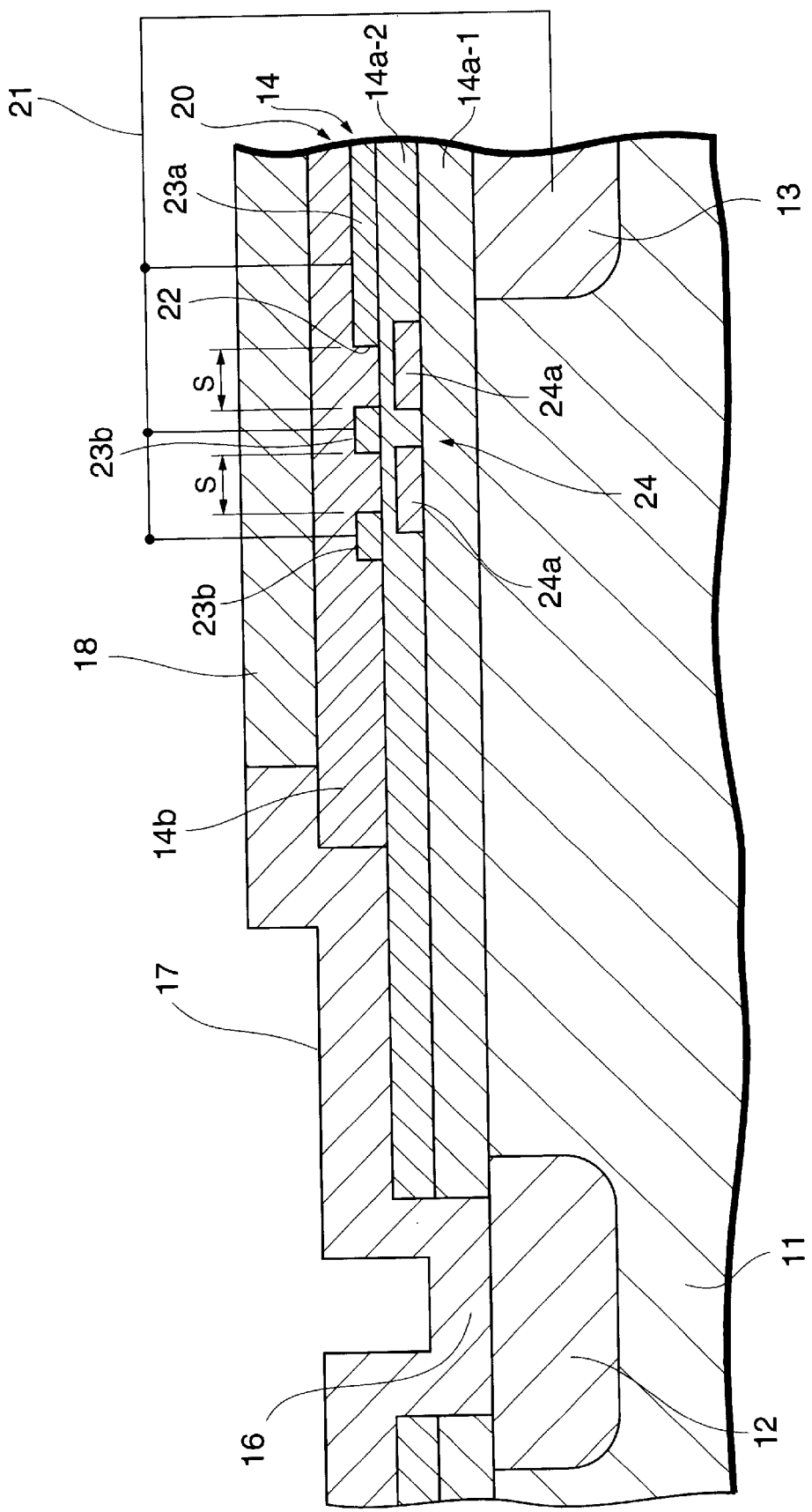
FIG. 4 is a sectional view of a third embodiment of the semiconductor device according to the present invention.

In a third embodiment shown in FIG. 4, as in the second embodiment, the expansion promotion means 24 consists of expansion promotion electrodes 24a buried in the electrically insulating film 14.

The expansion promotion electrodes 24a are formed of the same conductive material as in the expansion promotion electrodes 24a in the second embodiment and located on a first lower insulating layer 14a-1, the lowermost layer, of the electrically insulating film 14 on the above-mentioned surface of the semiconductor substrate 11. The expansion promotion electrodes 24a are arranged in parallel and mutually separated from each other in the extending direction of the current path 18. Formed on the first lower insulating layer 14a-1 is a second lower insulating layer 14a-2, which has the expansion promotion electrodes 24a buried therein. On the second lower insulating layer 14a-2, the suppressor electrode layer 20 is formed in such a way that the expansion promotion electrodes 24a are formed in positions corresponding to the intermediate areas between the narrow electrode portions 23b or between the narrow portion and the electrode main body 23a.

Thus, the expansion promotion electrodes 24a are formed in the electrically insulating film 14 in those areas on the plane (14a-1), located between the suppressor electrode layer 20 and the surface of the semiconductor substrate 11, which correspond to the intermediate areas between the narrow electrode portions. The expansion promotion electrodes 24a extend along the slits 22.

In the expansion promotion means 24 shown in FIG. 4, the expansion promotion electrodes 24a are not connected to the first impurity region 12 and therefore are electrically in the floating state. However, the expansion promotion electrodes 24a are located below the plane on which the suppressor electrode layer 20 is provided and therefore the expansion promotion electrodes 24a are arranged closer to the semiconductor substrate 11 than those expansion promotion electrodes 24a in the second embodiment. Meanwhile, as shown in FIG. 4, the width of the expansion promotion electrodes 24a can be set to be larger than the width s of the respective slits 22.

Therefore, the expansion promotion electrodes 24a shown in the third embodiment, though they are floating electrodes, are equally effective or more effective in promoting the expansion of the depletion layer 19 than the expansion promotion electrodes 24a in the second embodiment.

Therefore, according to the expansion promotion electrodes 24a in the third embodiment, the distance s between the narrow electrode portions 23b or the distance s between the narrow portion 23b and the electrode main body 23a can be decreased from 3 µm to 1 µm, for example, making it possible to further reduce the size of the semiconductor device 10.

<Embodiment 4>

Figure 5:
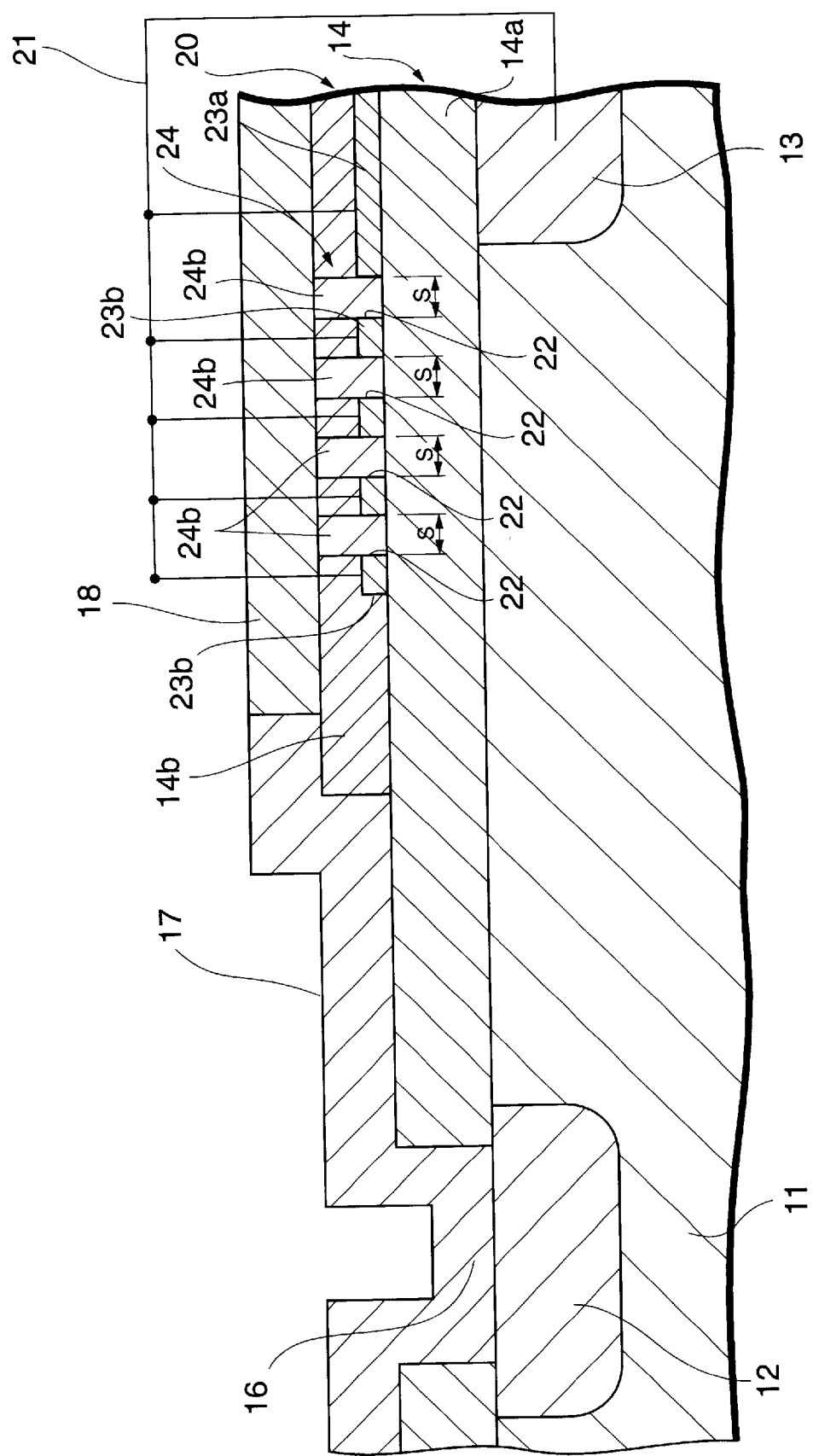
FIG. 5 is a sectional view of a fourth embodiment of the semiconductor device according to the present invention.

In FIG. 5, the expansion promotion means 24 consists of dielectric parts 24b having a greater dielectric constant than that of the electrically insulating film 14. The dielectric parts 24b are buried in the areas between the narrow electrode portions 23b and between the narrow electrode portion 23b and the electrode main body 23a in the electrically insulating film 14.

The dielectric parts 24b can be formed of an insulating material showing a higher dielectric constant than the electrically insulating film 14.

To form the dielectric parts 24b, after an upper insulating layer 14b is formed covering the suppressor electrode layer 20 formed on the lower insulating layer 14a on the semiconductor substrate 11, those parts of the upper insulating layer 14a of the electrically insulating film 14 which correspond to the slits 22 are etched away to a depth of 1 µm by photolithography, for example.

A dielectric material (24b), which has a higher dielectric constant than that of the lower and upper insulating layers 14a and 14b, is grown to a thickness of 1.5 µm, for example, to fill up those etched grooves.

After this, the unnecessary portions on the upper insulating layer 14b out of the dielectric material (24b) is removed by an amount corresponding to the thickness of 0.5 µm, for example, by a well-known chemical and machining polishing (CMP), for example, by which the dielectric parts 24b are formed in specified positions in the upper insulating layer 14b.

A current path 18 same as has been described above is formed on the electrically insulating film 14 (lower and upper layers 14a and 14b) in which the dielectric parts 24b are buried. The dielectric parts 24b located under the current path 18 exhibit a higher dielectric constant than that of the electrically insulating film 14. Therefore, the dielectric parts 24b function as substantially smaller in thickness than the electrically insulating film 14 by reason of electrostatic effect.

Therefore, like the thin insulating portions 14-1 in the first embodiment, the dielectric parts 24b promote the expansion of the depletion layer 19 more strongly than those portions of the electrically insulating film where there are no dielectric parts 24b, which correspond to the thin insulating portions.

Thus, according to the semiconductor device 10 having the expansion promotion means 24 consisting of the dielectric parts 24b, as in the first to third embodiments, the adequate width s of the respective slits 22 can be reduced from 6 µm to 4 µm, for which reason the semiconductor device 10 can be reduced in size.

A fifth embodiment and a sixth embodiment described below show the contrivances that have been made with regard to the arrangement of the narrow portions 23b of the suppressor electrode layer 20 or to the shape of the slits 22 formed in the suppressor electrode layer 20, to reduce the size of the semiconductor device 10 without sacrificing the dielectric strength.

<Embodiment 5>

Figure 6:
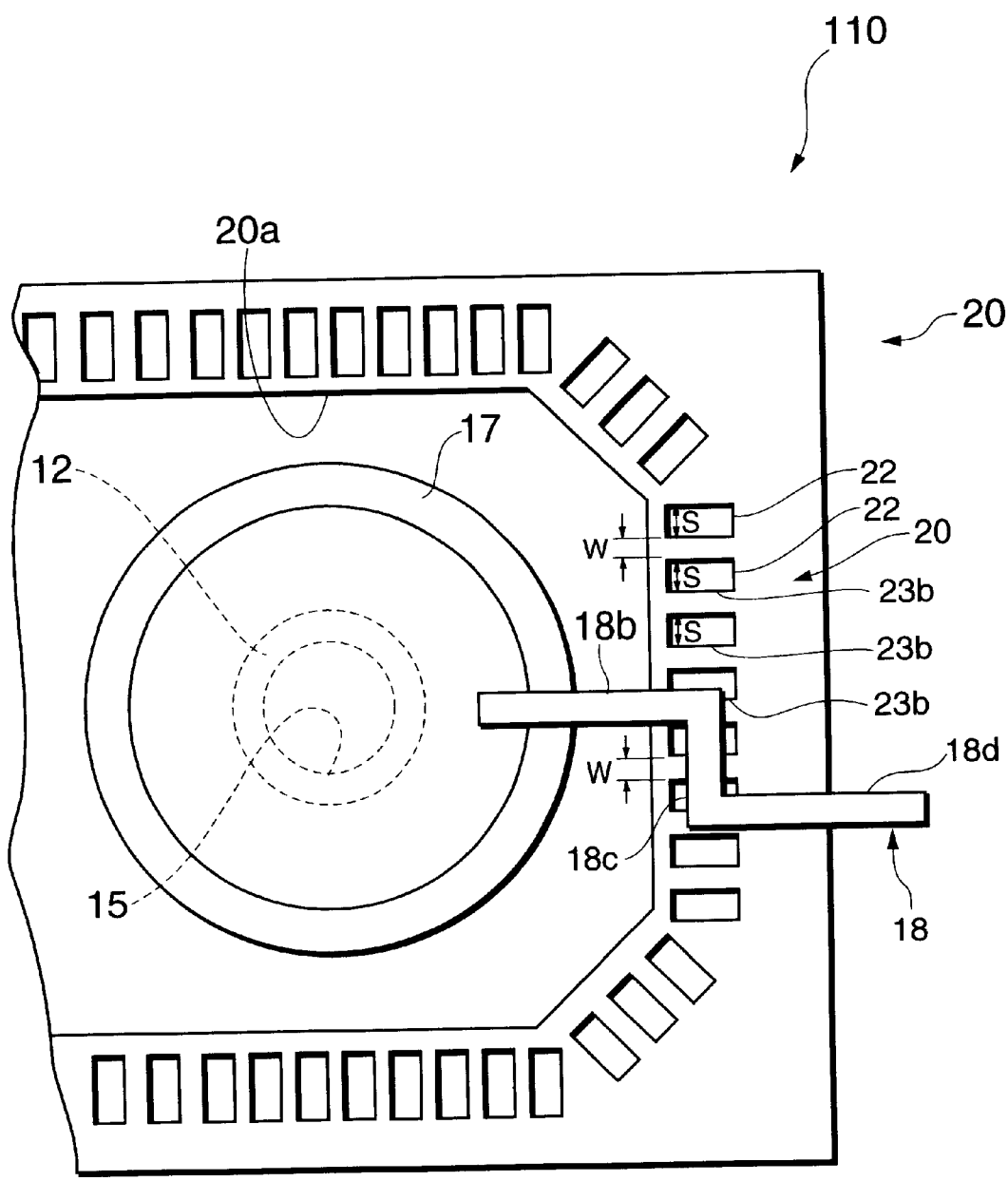
FIG. 6 is a plan view of a fifth embodiment of the semiconductor device according to the present invention.

FIG. 6 shows an example in which the narrow electrode portions 23b of the suppressor electrode layer 20 are arranged in a generally ring form in the electrically insulating film 14 in such a manner as surrounding the first impurity region 12.

The suppressor electrode layer 20, arranged in the electrically insulating film 14 covering the semiconductor substrate 11, is supplied with the potential of the semiconductor substrate 11, that is, the potential of the second impurity region 13 through the wire 21 same as has been described, but not shown. In the suppressor electrode layer 20, slits 22 each with a width of s are formed mutually spaced apart along the inner edge 20a of the suppressor electrode layer 20 in a manner of surrounding the first impurity region 12.

In the straight edge portion of the inner edge 20a, the slits 22 are formed mutually equally spaced by a distance w and arranged in line in the vertical and the horizontal directions in the plane of FIG. 6. Between the slits 22 arranged as described, a plurality of narrow electrode portions 23b are arranged in parallel in the direction of the width w, which is coincident with the width direction of the slits 22.

The current path 18 extending from the field plate 17 consists of a first extension line portion 18b extending in the horizontal direction, on the drawing of FIG. 6, from the peripheral edge of the field plate 17, that is, in the extending direction of those slits 22 or the narrow electrode portions 23b which are in the vicinity of the current path 18; a second extension line portion 18c extending in the width (w) direction of a plurality of the narrow electrode portions 23b lying at right angles with the first extension line portion in a manner of crossing those narrow portions 23b; and a third extension line portion 18d extending at a right angle from the tip of the second extension line portion, that is, in the direction parallel with the first extension line portion 18b.

In the semiconductor device 110 in the fifth embodiment in FIG. 6, the current path 18 extending on the electrically insulating film 14, in which the suppressor electrode layer 20 is buried, is formed in a crank shape consisting of the first, the second and the third extension line portions 18b, 18c and 18d.

While the leading end (19a to 19f in FIG. 1) of the depletion layer 19 extends along the current path 18 by increasing the backward voltage between the first impurity region 12 and the second impurity region 13, when the leading end, which is under the first extension line portion 18b, of the depletion layer 19 reaches the second extension line portion 18c lying at a right angle to the first extension line portion 18b, the depletion layer 19 turns its direction and is guided along the second extension line portion 18c, and then when the depletion layer 19 reaches the third extension line portion 18d, the depletion layer 19 extends guided along the third extension line portion 18d.

When the leading end of the depletion layer 19 is guided to a second extension line portion 18c, that is, a deformed portion 18c, because the narrow electrode portions 23b, to which a specified substrate-potential is applied, are arranged mutually spaced by a distance s in the extending direction of the second extension line portions 18 lying above the narrow portions 23b, the depletion layer 19 is adequately controlled in its expansion by the expansion restraining action of the narrow electrode portions 23b.

The narrow electrode portions 23b for restraining the expansion of the depletion layer 19 are arranged generally in a circumferential direction of the first impurity region 12 in the fifth embodiment of the invention.

On the other hand, in the example shown in the first embodiment, the narrow electrode portions 23b are arranged in line from the first impurity region 12 to the second impurity region 13. Therefore, if the required narrow electrode portions 23b increase in number, the distance between the impurity regions 12 and 13 has to be increased.

In contrast, according to the fifth embodiment, the narrow electrode portions 23b are arranged generally in the circumferential direction of the first impurity region 12 instead of arranging them in line from the first impurity region 12 to the second impurity region 13 as mentioned above. Therefore, even if the second extension line portion 18c are set such that the current path go across the necessary number of narrow electrode portions 23b, it never occurs that the straight distance from the first impurity region 12 to the third impurity region 13 is prolonged.

For this reason, because a necessary number of narrow electrode portions 23b can be provided without increasing the distance between the first impurity region 12 and the second impurity region 13, a small-size version of the semiconductor device 110 can be achieved without decreasing a desired dielectric strength.

Further, the third extension line portion 18d of the current path can be led out either in the vertical or horizontal direction of the semiconductor device 110 shown in FIG. 6 as necessity requires, which offers a greater freedom in wiring.

<Embodiment 6>

Figure 7:
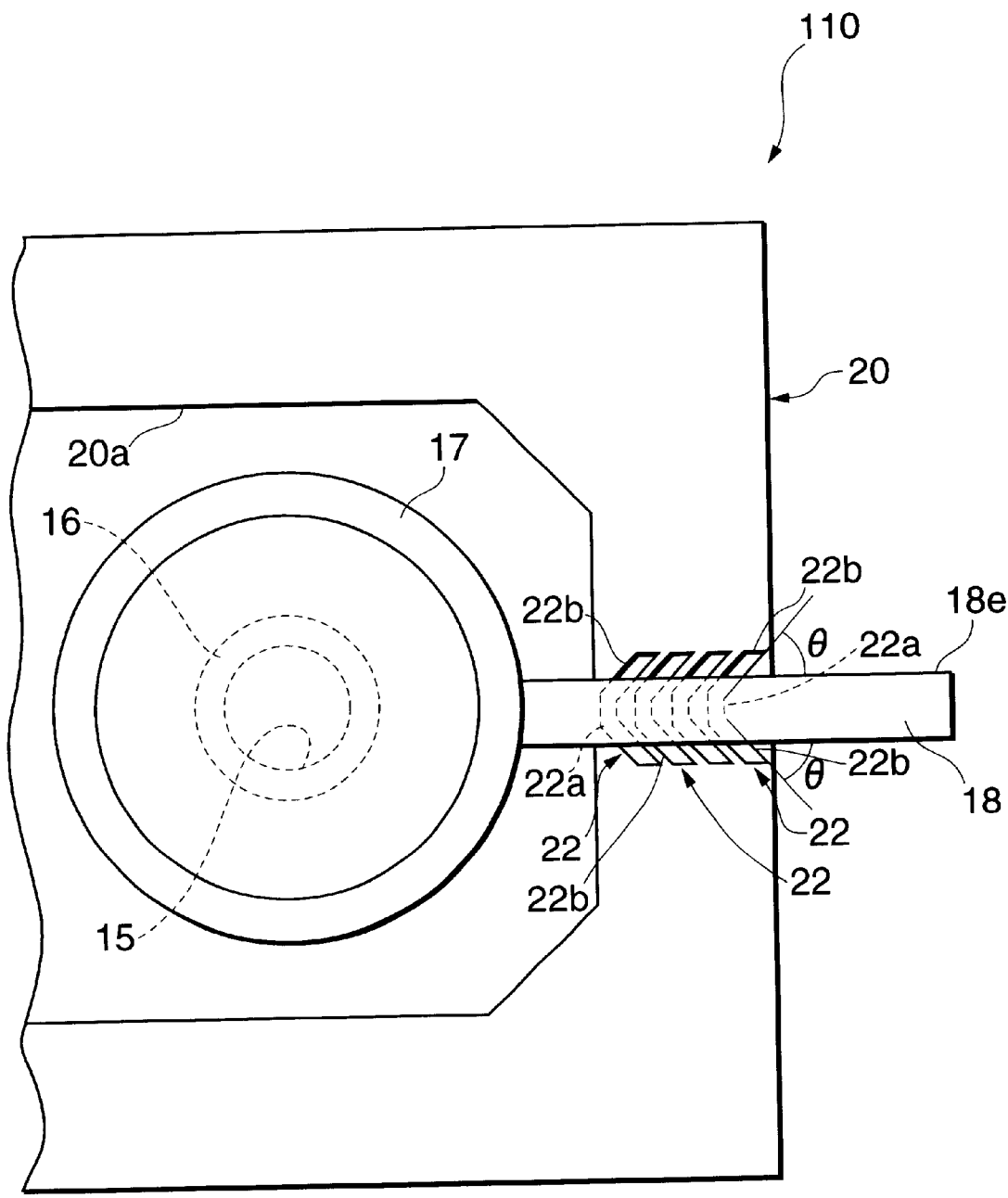
FIG. 7 is a plan view of a sixth embodiment of the semiconductor device according to the present invention.

In the semiconductor device 110 in the sixth embodiment shown in FIG. 7, the required width s of the respective slits 22 can be decreased by making contrivances to the shape of the slits 22 formed in the suppressor electrode layer 20.

In the semiconductor device 110 shown in FIG. 7, the slits 22 are formed in the suppressor electrode layer 20 buried in the electrically insulating film 14 under the current path 18 extending from the peripheral edge of the field plate 17 toward the second impurity region 13. Each slit 22 consists of a central portion 22a formed in the width direction of the current path 18 and a pair of side extensions 22 extending at an acute angle θ to both side edges of the current path 18 and inclined toward the current path 18.

When the depletion layer 19 guided under the current path 18 reaches the slits 22, the leading end of the depletion layer 19 is guided along the slits 22. At this time, in the sixth embodiment, because the side extensions of the slits 22 are obliquely inclined toward the extending direction of the depletion layer 19, the depletion layer 19 is guided effectively toward the side extensions 22b of the slits 22.

Consequently, under the condition that expansion of the depletion layer 19 is controlled by the narrow electrode portions 23b defined by the slits 22, the depletion layer 19 is permitted to expand to the side extensions 22b of the corresponding slits 22. For this reason, the electric fields in the depletion layer 19 can be reduced according to the amount of expansion of the depletion layer 19 to the side extensions 22b of the slits 22, which makes possible a substantial reduction of the width s of the respective slits.

<Additional Example 1>

Figure 8:
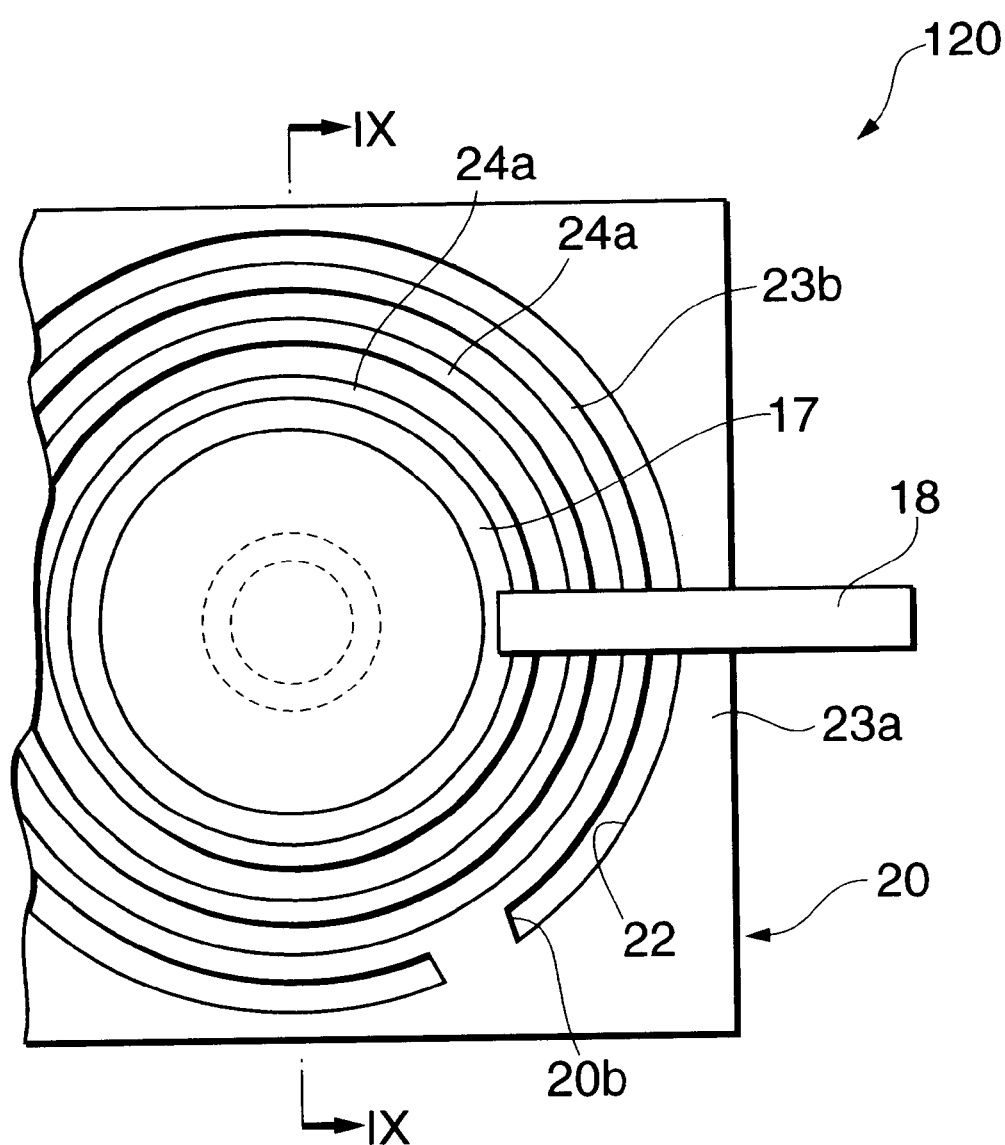
FIG. 8 is a plan view of an additional example of the semiconductor device according to the present invention.
Figure 9:
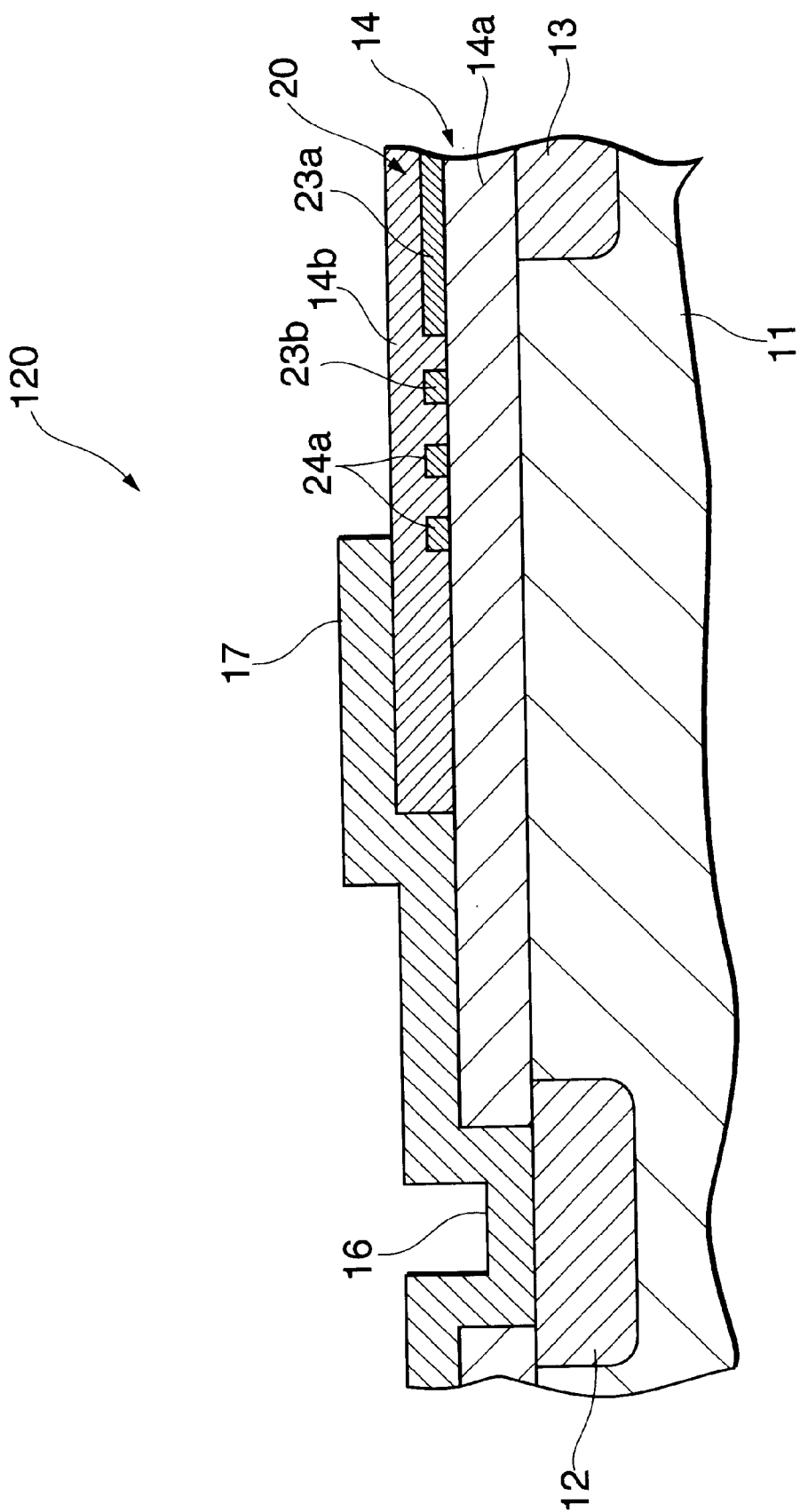
FIG. 9 is a sectional view of the semiconductor device shown in FIG. 8.

FIGS. 8 and 9 concern the field plate 17, and shows a technique for preventing a decrease in the electric fields at the peripheral edge of the circular depletion layer 19 of the circular depletion layer 19 corresponding to the peripheral edge of the field plate.

In the semiconductor device 120 shown in FIGS. 8 and 9, in the semiconductor substrate 11 in which the first impurity region 12 and the second impurity region 13 are formed, the electrically insulating film 14 consisting of the lower insulating layer 14a and the upper insulating layer 14b is formed. Two expansion promotion electrodes 24a are arranged in the suppressor electrode layer 20 formed on the lower insulating layer 14a of the electrically insulating film 14.

The suppressor electrode layer 20 is supplied with the potential of the semiconductor substrate 11 as mentioned above. In the electrode main body 23a placed at the substrate potential, the narrow electrode portions 23b defined by the circular slits 22 are formed and those narrow portions 23a are connected through a connecting part 20b to the electrode main body 23a.

On the lower insulating layer 14a on which the suppressor electrode layer 20 is formed, a pair of circular expansion promotion electrodes 24a concentric with the narrow electrode portion 23b are formed on the same plane on which the suppressor electrode layer 20 is formed.

As clearly shown in FIG. 9 depicting a sectional view taken along the line IX—IX in FIG. 8, the inner one of the circular expansion promotion electrodes 24a is arranged under the peripheral edge of the field plate 17. The outer circular expansion promotion electrode 24a, on the other hand, is arranged between the inner expansion promotion electrode 24a and the circular narrow electrode portion 23b, with this outer expansion promotion electrode 24a equally spaced from those electrodes 24a and 23b. The two expansion promotion electrodes 24a are floating electrodes.

The expansion promotion electrodes 24a promote the expansion of the depletion layer 17 at the peripheral edge of the field plate 17, and smoothly guide the depletion layer 19 along the current path 18 above it, thus serving to reduce the fields in the depletion layer 19 at the peripheral edge of the field plate 17.

Owing to the electric field reduction effect in the depletion layer 19 at the peripheral edge of the field plate 17 by the arrangement of the inner expansion promotion electrode 24a under the peripheral edge of the field plate 17, it is possible to reduce the thickness if the electrically insulating film 14 under the current path 18 to 1.5 μm or less, for example, which makes it possible to a thinner semiconductor device 120.

<Additional Example 2>

Figure 10:
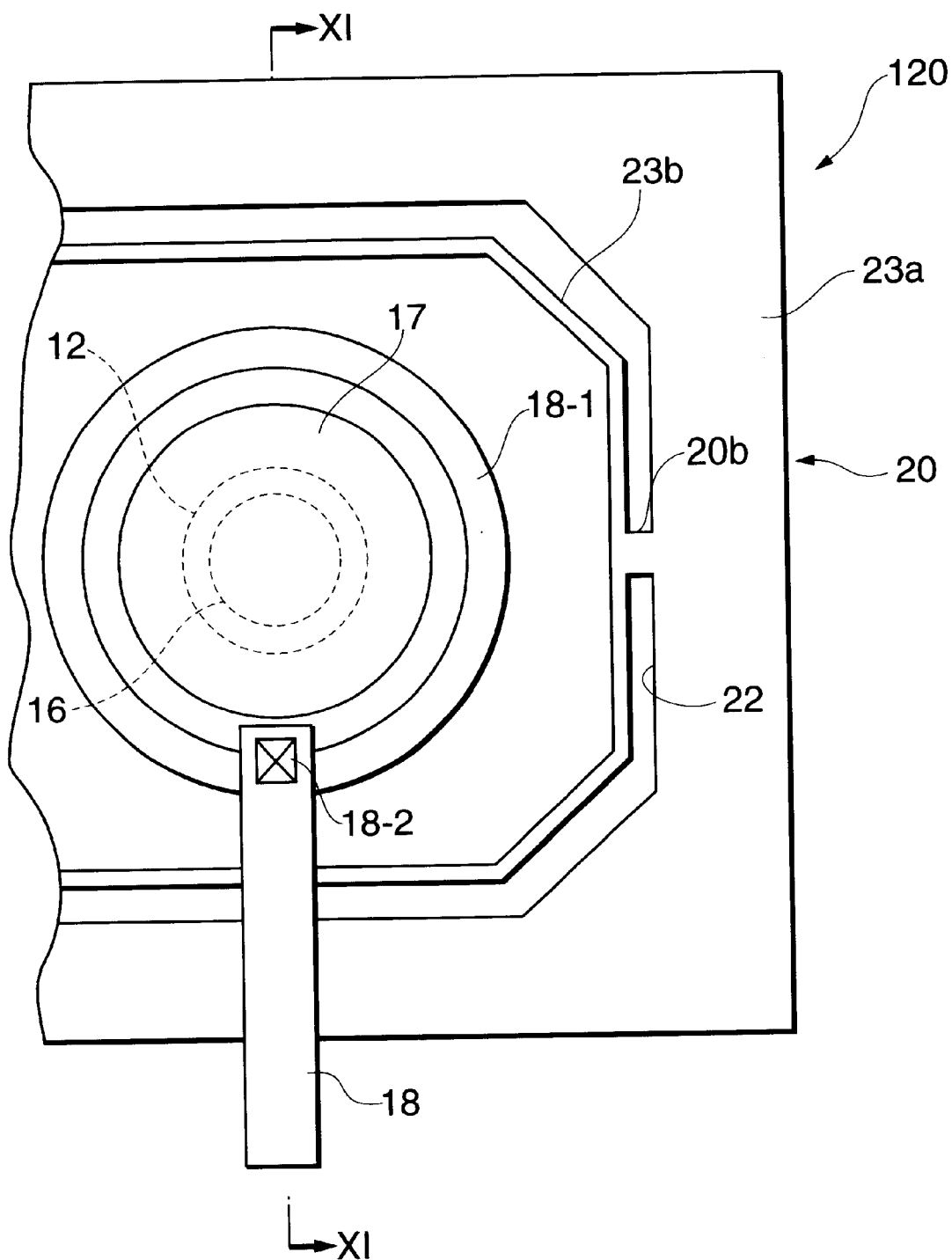
FIG. 10 is a plan view of another example of the semiconductor device according to the present invention.
Figure 11:
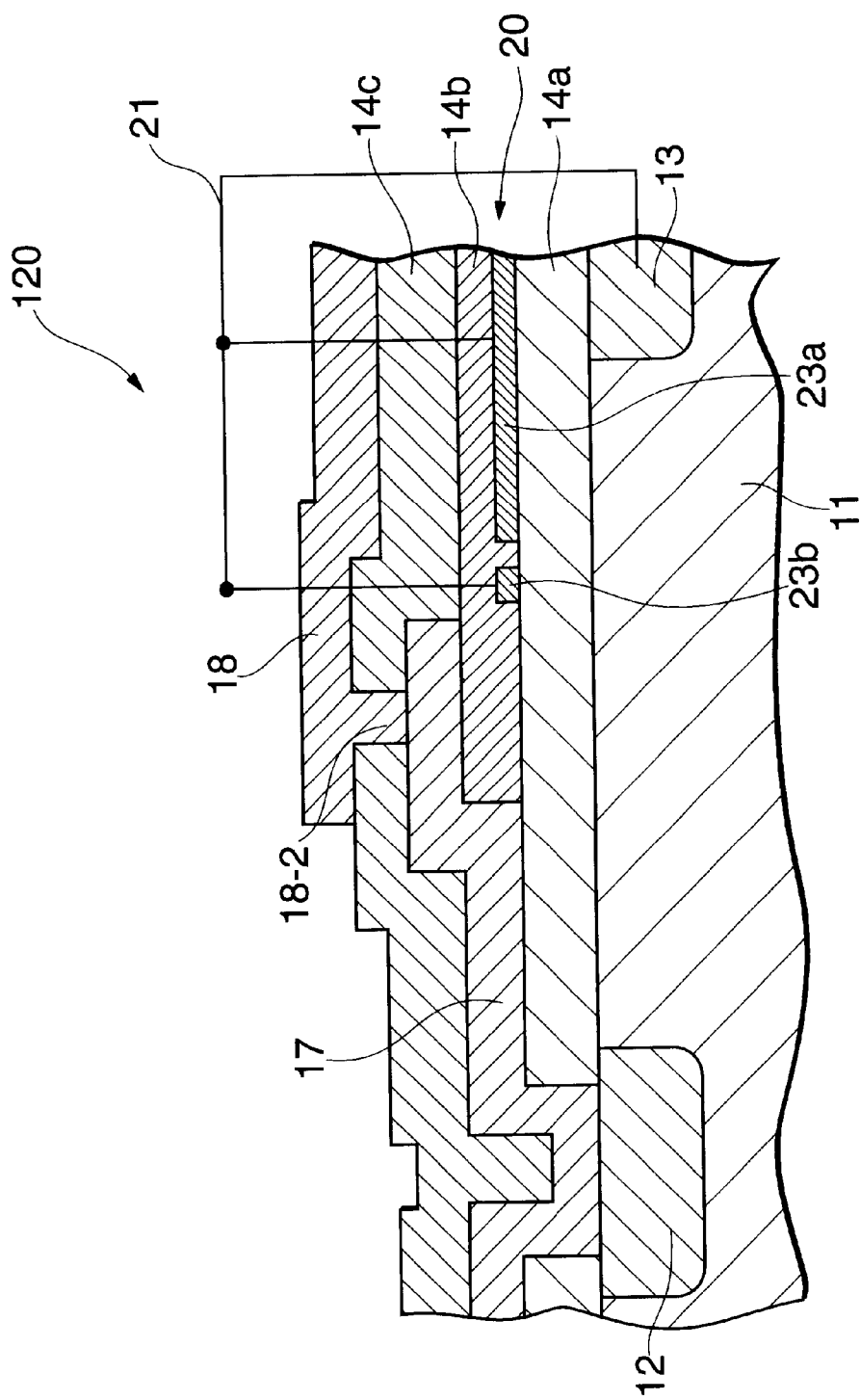
FIG. 11 is a sectional view of the semiconductor device shown in FIG. 10.

FIGS. 10 and 11 show an example of semiconductor device 120 in which the field plate is formed by a first metal layer and the current path 18 is formed by a second metal layer, which is connected through a contact 18-2 to the field plate 17.

On the semiconductor substrate 11 at the surface of which the first impurity region 12 and the second impurity region 13 have been prepared, an electrically insulating film 14 is formed, which consists of a lower insulating layer 14a with a thickness of 1 μm for example, an upper insulating layer 14b with a thickness of 1 μm for example, and an uppermost insulating layer 14c with a thickness of 0.5 μm for example.

The suppressor electrode layer 20 is formed on the lower insulating layer 14a and is covered with the upper insulating layer 14b. The uppermost layer 14c is formed covering the upper insulating layer 14b and the field plate 17, and the current path is formed on the uppermost layer.

According to the semiconductor device shown in FIGS. 10 and 11, the increased thickness of the electrically insulating film 14 improves the dielectric strength, and therefore a necessary dielectric strength can be secured for the semiconductor device 120 by providing a single narrow electrode portion 23b in the suppressor electrode layer 20. Thus, it becomes possible to make the semiconductor device 10 in a compact size.

In the foregoing, the semiconductor device according to the present invention has been shown as diodes. The present invention, however, is not limited to diodes, but can be applied to MOS transistors and other types of semiconductor elements according to circumstances.

According to the present invention, as has been described, by arranging the depletion-layer expansion promotion means for more promoting the expansion than does the insulating film containing the suppressor electrode layer, between the suppressor-electrode narrow portions for controlling the expansion of the depletion layer, the space between the narrow electrode portions can be reduced without sacrificing the electric field reducing effect of the field reducing means including the expansion promotion means and the suppressor electrode layer and without disturbing the balance between the junction dielectric strength and the breakdown voltage of the depletion layer. Consequently, the semiconductor device can be reduced in size without decreasing the dielectric strength.

According to the present invention, by arranging the narrow electrode portions of the suppressor electrode layer in a circumferential direction of the first impurity region, which makes it possible to arrange a large number of narrow electrodes of the suppressor electrode layer without incurring a dimensional increase of the space between the two impurity regions, an effective reduction of electric fields can be achieved without causing an increase in size, so that the semiconductor device in a smaller size can be achieved without decreasing the dielectric strength.

According to the present invention, the slits between the narrow electrodes of the suppressor electrode layer may be added with side extensions extending from both side edges of the current path, which stretches from the first impurity region, and inclined at an acute angle toward the extending direction of the conductor. By this arrangement, the leading end of the depletion layer can be guided to the extending direction of the leading end of the side extensions, which effectively suppress a breakdown in the depletion layer and makes it possible to decrease the width of the respective slits, that is, the space between the narrow electrode portions. Thus, it becomes possible to produce semiconductor devices in reduced sizes.

What is claimed is:

1. A semiconductor device comprising:
   a semiconductor substrate of one conductivity type, p-type or n-type;
   a first impurity region of the other conductivity type, p-type or n-type, having applied between itself and said semiconductor substrate a backward voltage through an electric conductor extending on an electrically insulating film provided on the surface of said semiconductor substrate;
   a second impurity region of said one conductivity type and with a higher density than the impurity density of said semiconductor substrate, said second impurity region being formed in the surface of said semiconductor substrate spaced from said first impurity region, to control a depletion layer tending to expand from said first impurity region below and in line with said conductor;
   a suppressor electrode layer comprising a plurality of thin electrode portions arranged in said electrically insulating film and mutually spaced apart from each other in the direction of said conductor and having substantially the same potential as said semiconductor substrate, to control said depletion layer tending to expand toward said second impurity region; and
   expansion promotion means for promoting the expansion of said depletion layer toward said second impurity region provided between said thin electrode portions of said suppressor electrode layer, said expansion promotion means being thin portions of said electrically insulating film, defined horizontally between said thin electrode portions and vertically between said surface of said semiconductor substrate and protrusions of said conductor that protrude toward said substrate extending over said electrically insulating film on said semiconductor substrate, said thin portions of said insulating film being defined between said thin electrode portions of said suppressor electrode layer.

2. A semiconductor device according to claim 1, wherein said electrically insulating film is a stacked-layer structure including a lower insulating layer and an upper insulating layer that partly covers the lower insulating layer, said plurality of thin electrode portions being arranged in said upper insulating layer.

3. A semiconductor device according to claim 1, wherein said conductor with protrusions is disposed on top of said upper insulating layer with said protrusions protruding into said upper insulating layer so that the thickness of the thin portions of electrically insulating film is less than the thickness of the electrically insulating film and the distance of the resultant current path from the semiconductor substrate to the conductor is smaller at the thin portions of the electrically insulating film than at the adjacent thin electrode portions.

4. A semiconductor device comprising:
   a semiconductor substrate of one conductivity type, p-type or n-type;
   a first impurity region of the other conductivity type, p-type or n-type, having applied between itself and said semiconductor substrate a backward voltage through an electric conductor extending on an electrically insulating film provided on the surface of said semiconductor substrate;
   a second impurity region of said one conductivity type and with a higher impurity density than the impurity density of said semiconductor substrate, said second impurity region being formed in the surface of said semiconductor substrate spaced from said first impurity region, to control a depletion layer tending to expand from said first impurity region below and in line with said conductor;
   a suppressor electrode layer comprising a plurality of narrow electrode portions arranged in said electrically insulating film and mutually spaced apart from each other in the direction of said conductor and having substantially the same potential as said semiconductor substrate, to control said depletion layer tending to expand toward said second impurity region, and expansion promotion means for promoting the expansion of said depletion layer toward said second impurity region provided between said narrow electrode portions of said suppressor electrode layer, said expansion promotion means consisting of a plurality of expansion promotion electrodes arranged in positions corresponding to the spaces between said narrow portions of said suppressor electrode layer, said expansion promotion electrodes and said narrow electrode portions of said suppressor electrode layer being arranged in an alternating manner in said electrically insulating film.

5. A semiconductor device according to claim 3, wherein said expansion promotion electrodes are arranged spaced apart from the narrow portions of said suppressor electrode layer on the same plane as said suppressor electrode layer.

6. A semiconductor device according to claim 3, wherein said expansion promotion electrodes are arranged in said electrically insulating film in those positions on a plane between said suppressor electrode layer and said surface of the semiconductor substrate corresponding to the spaces between said narrow portions.

7. A semiconductor device according to claim 3, wherein said expansion promotion electrodes are put in electrically floating state.

8. A semiconductor device according to claim 3, wherein said expansion promotion electrodes are placed at a potential substantially equal to the potential of said first impurity region.

9. A semiconductor device according to claim 4, wherein said suppressor electrode layer and plurality of narrow electrode portions are electrically connected to said second impurity region and have the potential of said second impurity region.

10. A semiconductor device according to claim 9, wherein said expansion promotion electrodes are supplied with the potential of said first impurity region, which is opposite in polarity to the potential of the suppressor electrode layer to suppress the expansion of said depletion layer.

11. A semiconductor device according to claim 10, wherein said expansion promotion electrodes are arranged on the same plane as said suppressor electrode layer.

12. A semiconductor device according to claim 4, wherein said electrically insulating film is a stacked-layer structure including first and second lower insulating layers and an upper insulating layer that partly covers the second lower insulating layer, said plurality of thin electrode portions being arranged in said upper insulating layer and said expansion promotion means being formed in said second lower insulating layer.

13. A semiconductor device according to claim 12, wherein said expansion promotion means is formed of expansion promotion electrodes arranged in parallel and separated from one another in the direction of said conductor, said expansion promotion electrodes being formed in said second lower insulating layer in an area below and intermediate of the thin electrode portions.

14. A semiconductor device according to claim 13, wherein said expansion promotion electrodes are electrically in the floating state.

15. A semiconductor device comprising:
a semiconductor substrate of one conductivity type, p-type or n-type;
a first impurity region of the other conductivity type, p-type or n-type, having applied between itself and said semiconductor substrate a backward voltage through an electric conductor extending on an electrically insulating film provided on the surface of said semiconductor substrate;
a second impurity region of said one conductivity type and with a higher impurity density than the impurity density of said semiconductor substrate, said second impurity region being formed in the surface of said semiconductor substrate spaced from said first impurity region, to control a depletion layer tending to expand from said first impurity region below and in line with said conductor;
a suppressor electrode layer comprising a plurality of thin electrodes portions arranged in said electrically insulating film and mutually spaced apart from each other in the direction of said conductor and having substantially the same potential as said semiconductor substrate, to control said depletion layer tending to expand toward said second impurity region; and
expansion promotion means for promoting the expansion of said depletion layer toward said second impurity region disposed between said thin electrode portions of said suppressor electrode layer, said expansion promotion means consisting of a dielectric material with a larger dielectric constant than the dielectric constant of said electrically insulating film.

16. A semiconductor device according to claim 15, wherein said electrically insulating film is a stacked-layer structure including a lower insulating layer and an upper insulating layer that partly covers the lower insulating layer, said plurality of thin electrode portions being arranged in said upper insulating layer.

17. A semiconductor device according to claim 16, wherein the dielectric material of said expansion promotion means extends from said lower insulating layer through said upper insulating layer.

18. A semiconductor device comprising:
a semiconductor substrate of one conductivity type, p-type or n-type;
a first impurity region of the other conductivity type, p-type or n-type, having applied between itself and said semiconductor substrate a backward voltage through an electric conductor extending on an electrically insulating film provided on the surface of said semiconductor substrate;
a second impurity region of said one conductivity type and with a higher impurity density than the impurity density of said semiconductor substrate, said second impurity region being formed in the surface of said semiconductor substrate spaced from said first impurity region, to control a depletion layer tending to expand from said first impurity region below and in line with said conductor; and
a suppressor electrode layer comprising a plurality of narrow portions arranged in said electrically insulating layer and mutually spaced from each other and having substantial the same potential as said semiconductor substrate, to control said depletion layer tending to expand toward said second impurity region, wherein said narrow portions of said suppressor electrode layer are arranged in a circumferential direction of said first impurity region, and wherein said conductor comprises as a part thereof a deformed portion arranged in the direction in which said narrow portions are arranged.

19. A semiconductor device comprising:
a semiconductor substrate of one conductivity type, p-type or n-type;

a first impurity region of the other conductivity type, p-type or n-type, having applied between itself and said semiconductor substrate a backward voltage through an electric conductor extending on an electrically insulating film provided on the surface of said semiconductor substrate;

a second impurity region of said one conductivity type and with a higher impurity density than the impurity density of said semiconductor substrate, said second impurity region being formed in the surface of said semiconductor substrate spaced from said first impurity region, to control a depletion layer tending to expand from said first impurity region below and in line with said conductor;

a suppressor electrode layer comprising a plurality of narrow portions arranged in said electrically insulating layer and mutually spaced from each other and having substantially the same potential as said semiconductor substrate, to control said depletion layer tending to expand toward said second impurity region, wherein between said narrow portions of said suppressor electrode layer, slits are defined as having extensions extending beyond both sides of said conductor stretching from said first impurity region, and inclined at an acute angle to the extending direction of said conductor, and wherein each said slit has said extensions provided at both ends.

* * * * *